(12) United States Patent
Haase

(10) Patent No.: US 7,863,634 B2
(45) Date of Patent: Jan. 4, 2011

(54) LED DEVICE WITH RE-EMITTING SEMICONDUCTOR CONSTRUCTION AND REFLECTOR

(75) Inventor: Michael A. Haase, St. Paul, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 455 days.

(21) Appl. No.: 11/761,148

(22) Filed: Jun. 11, 2007

(65) Prior Publication Data

US 2007/0284592 A1 Dec. 13, 2007

Related U.S. Application Data

(60) Provisional application No. 60/804,538, filed on Jun. 12, 2006.

(51) Int. Cl.
*H01L 29/22* (2006.01)
(52) U.S. Cl. .......................................... 257/98; 257/13
(58) Field of Classification Search .................... 257/13, 257/14, 88, 90, 96–99, E33.008, E33.045, 257/E33.046, E33.058, E33.067, E33.072
See application file for complete search history.

(56) References Cited

U.S. PATENT DOCUMENTS

| | | | |
|---|---|---|---|
| 5,540,978 | A | 7/1996 | Schrenk |
| 5,851,905 | A | 12/1998 | McIntosh et al. |
| 5,882,774 | A | 3/1999 | Jonza et al. |
| 5,998,925 | A | 12/1999 | Shimizu et al. |
| 6,010,751 | A | 1/2000 | Shaw et al. |
| 6,172,810 | B1 | 1/2001 | Fleming et al. |
| 6,303,404 | B1 | 10/2001 | Moon et al. |
| 6,337,536 | B1 | 1/2002 | Matsubara et al. |
| 6,504,171 | B1 | 1/2003 | Grillot et al. |

(Continued)

FOREIGN PATENT DOCUMENTS

| | | |
|---|---|---|
| EP | 733919 | 9/2003 |
| JP | 2004-072047 | 3/2004 |
| WO | WO 97/01778 | 1/1997 |
| WO | WO 01/75490 | 10/2001 |
| WO | WO 2004/068552 | 8/2004 |

OTHER PUBLICATIONS

U.S. Appl. No. 10/762,678, filed Jan. 20, 2004, titled Phosphor Based Light Sources Having Front Illumination.

(Continued)

*Primary Examiner*—Hung Vu
(74) *Attorney, Agent, or Firm*—Kristofor L. Storvick

(57) ABSTRACT

Briefly, the present disclosure provides a device comprising: a) an LED capable of emitting light at a first wavelength; b) a re-emitting semiconductor construction which comprises a potential well not located within a pn junction; and c) a reflector positioned to reflect light emitted from the LED onto the re-emitting semiconductor construction. Alternately, the device comprises: a) an LED capable of emitting light at a first wavelength; b) a re-emitting semiconductor construction capable of emitting light at a second wavelength which comprises at least one potential well not located within a pn junction; and c) a reflector which transmits light at said first wavelength and reflects at least a portion of light at said second wavelength. Alternately, the device comprises a semiconductor unit comprising a first potential well located within a pn junction which comprises a LED capable of emitting light at a first wavelength, and a second potential well not located within a pn junction which comprises a re-emitting semiconductor construction.

32 Claims, 8 Drawing Sheets

U.S. PATENT DOCUMENTS

| | | | |
|---|---|---|---|
| 6,531,230 | B1 | 3/2003 | Weber et al. |
| 6,734,467 | B2 | 5/2004 | Schlereth et al. |
| 6,991,695 | B2 | 1/2006 | Tait et al. |
| 7,045,375 | B1 | 5/2006 | Wu et al. |
| 7,091,653 | B2 | 8/2006 | Ouderkirk et al. |
| 7,091,661 | B2 | 8/2006 | Ouderkirk et al. |
| 7,157,839 | B2 | 1/2007 | Ouderkirk et al. |
| 7,210,977 | B2 | 5/2007 | Ouderkirk et al. |
| 7,245,072 | B2 | 7/2007 | Ouderkirk et al. |
| 2002/0041148 | A1 | 4/2002 | Cho et al. |
| 2002/0134989 | A1 | 9/2002 | Yao et al. |
| 2002/0154406 | A1 | 10/2002 | Merrill et al. |
| 2003/0006430 | A1* | 1/2003 | Shibata et al. .............. 257/200 |
| 2004/0075102 | A1 | 4/2004 | Chen et al. |
| 2004/0144987 | A1* | 7/2004 | Ouderkirk et al. ............. 257/98 |
| 2004/0145289 | A1 | 7/2004 | Ouderkirk et al. |
| 2004/0145312 | A1 | 7/2004 | Ouderkirk et al. |
| 2004/0145895 | A1 | 7/2004 | Ouderkirk et al. |
| 2006/0124917 | A1 | 6/2006 | Miller et al. |
| 2006/0124918 | A1 | 6/2006 | Miller et al. |

OTHER PUBLICATIONS

Dalmasso et al., *Injection Dependence of the Electroluminescence Spectra of Re-emitting semiconductor construction Free GaN-Based White Light Emitting Diodes*, phys. stat. sol. (a) 192, No. 1, 139-143 (2003).

Damilano et al., *Monolithic White Light Emitting Diodes Based on InGaN/GaN Multiple-Quantum Wells*, Jpn. J. Appl. Phys. vol. 40 (2001) pp. L918-L920.

Herbert Kroemer, *Quantum Mechanics for Engineering, Materials Science and Applied Physics* (Prentice Hall, Englewood Cliffs, New Jersey, 1994) at pp. 54-63.

Luo et al., *Patterned three-color ZnCdSe/ZnCdMgSe quantum-well structures for integrated full-color and white light emitters*, App. Phys. Letters, vol. 77, No. 26, pp. 4259-4261 (2000).

Yamada et al., *Re-emitting semiconductor construction Free High-Luminous-Efficiency White Light-Emitting Diodes Composed of InGaN Multi-Quantum Well*, Jpn. J. Appl. Phys. vol. 41 (2002) pp. L246-L248.

Zory, ed., *Quantum Well Lasers* (Academic Press, San Diego, California, 1993) at pp. 72-79.

\* cited by examiner

LED DEVICE WITH RE-EMITTING SEMICONDUCTOR CONSTRUCTION AND REFLECTOR

CROSS REFERENCE TO RELATED APPLICATIONS

This application claims the benefit of U.S. Provisional Patent Application No. 60/804,538, filed Jun. 12, 2006, the disclosure of which is incorporated by reference herein in its entirety.

The following co-owned and currently pending U.S. patent applications are incorporated herein by reference: U.S. Ser. Nos. 11/009,217; 11/009,241; 10/762,678; 10/726,997; 10/726,790; 10/726,995; 10/727,072; 10/727,026; 10/726,968; 10/762,724; and 10/762,727.

FIELD OF THE DISCLOSURE

The present invention relates to light sources. More particularly, the present invention relates to light sources in which light emitted from a light emitting diode (LED) impinges upon and excites a re-emitting semiconductor construction to down-convert a portion of the emitted light to longer wavelengths.

BACKGROUND OF THE DISCLOSURE

Light emitting diodes (LED's) are solid-state semiconductor devices which emit light when an electrical current is passed between anode and cathode. Conventional LED's contain a single pn junction. The pn junction may include an intermediate undoped region; this type of pn junction may also be called a pin junction. Like non-light emitting semiconductor diodes, conventional LED's pass an electrical current much more readily in one direction, i.e., in the direction where electrons are moving from the n-region to the p-region. When a current passes in the "forward" direction through the LED, electrons from the n-region recombine with holes from the p-region, generating photons of light. The light emitted by a conventional LED is monochromatic in appearance; that is, it is generated in a single narrow band of wavelengths. The wavelength of the emitted light corresponds to the energy associated with electron-hole pair recombination. In the simplest case, that energy is approximately the band gap energy of the semiconductor in which the recombination occurs.

Conventional LED's may additionally contain one or more quantum wells at the pn junction which capture high concentrations of both electrons and holes, thereby enhancing light-producing recombination. Several investigators have attempted to produce an LED device which emits white light, or light which appears white to the 3-color perception of the human eye.

Some investigators report the purported design or manufacture of LED's having multiple quantum wells within the pn junction, where the multiple quantum wells are intended to emit light at different wavelengths. The following references may be relevant to such a technology: U.S. Pat. Nos. 5,851,905; 6,303,404; 6,504,171; 6,734,467; Damilano et al., *Monolithic White Light Emitting Diodes Based on InGaN/GaN Multiple-Quantum Wells*, Jpn. J. Appl. Phys. Vol. 40 (2001) pp. L918-L920; Yamada et al., *Re-emitting semiconductor construction Free High-Luminous-Efficiency White Light-Emitting Diodes Composed of InGaN Multi-Quantum Well*, Jpn. J. Appl. Phys. Vol. 41 (2002) pp. L246-L248; Dalmasso et al., *Injection Dependence of the Electroluminescence Spectra of Re-emitting semiconductor construction Free GaN-Based White Light Emitting Diodes*, phys. stat. sol. (a) 192, No. 1, 139-143 (2003).

Some investigators report the purported design or manufacture of LED devices which combine two conventional LED's, intended to independently emit light at different wavelengths, in a single device. The following references may be relevant to such a technology: U.S. Pat. Nos. 5,851,905; 6,734,467; U.S. Pat. Pub. No. 2002/0041148 A1; U.S. Pat. Pub. No. 2002/0134989 A1; and Luo et al., *Patterned three-color ZnCdSe/ZnCdMgSe quantum-well structures for integrated full-color and white light emitters*, App. Phys. Letters, vol. 77, no. 26, pp. 4259-4261 (2000).

Some investigators report the purported design or manufacture of LED devices which combine a conventional LED element with a chemical re-emitting semiconductor construction, such as yttrium aluminum garnet (YAG), which is intended to absorb a portion of the light emitted by the LED element and re-emit light of a longer wavelength. U.S. Pat. Nos. 5,998,925 and 6,734,467 may be relevant to such a technology.

Some investigators report the purported design or manufacture of LED's grown on a ZnSe substrate n-doped with I, Al, Cl, Br, Ga or In so as to create fluorescing centers in the substrate, which are intended to absorb a portion of the light emitted by the LED element and re-emit light of a longer wavelength. U.S. Pat. No. 6,337,536 and Japanese Pat. App. Pub. No. 2004-072047 may be relevant to such a technology.

SUMMARY OF THE DISCLOSURE

Briefly, the present disclosure provides a device comprising: a) an LED capable of emitting light at a first wavelength; b) a re-emitting semiconductor construction which comprises a potential well not located within a pn junction; and c) a reflector positioned to reflect light emitted from the LED onto the re-emitting semiconductor construction. The re-emitting semiconductor construction may additionally comprise an absorbing layer closely adjacent or immediately adjacent to a potential well. Potential wells may be quantum wells. In one embodiment, the re-emitting semiconductor construction is capable of emitting light at a second wavelength and the reflector reflects light at said first wavelength and transmits light at said second wavelength. The reflector may be a multilayer reflector, a non-planar flexible multilayer reflector, or a reflective polarizer layer.

In another aspect, the present disclosure provides a device comprising: a) an LED capable of emitting light at a first wavelength; b) a re-emitting semiconductor construction capable of emitting light at a second wavelength which comprises at least one potential well not located within a pn junction; and c) a reflector which transmits light at said first wavelength and reflects at least a portion of light at said second wavelength. The re-emitting semiconductor construction may additionally comprise an absorbing layer closely adjacent or immediately adjacent to a potential well. Potential wells may be quantum wells. The reflector may be positioned between the LED and the re-emitting semiconductor construction. The reflector may be a multilayer reflector or a non-planar flexible multilayer reflector.

In another aspect, the present disclosure provides a device comprising: a) a semiconductor unit comprising: i) a first potential well located within a pn junction which comprises a LED capable of emitting light at a first wavelength, and ii) a second potential well not located within a pn junction which comprises a re-emitting semiconductor construction; and b) a reflector positioned to reflect light emitted from the LED onto the re-emitting semiconductor construction. The re-emitting semiconductor construction may additionally comprise an absorbing layer closely adjacent or immediately adjacent to a potential well. Potential wells may be quantum wells. In one embodiment, the re-emitting semiconductor construction is capable of emitting light at a second wavelength and the reflector reflects light at said first wavelength and transmits light at said second wavelength. The reflector may be a multilayer reflector, a non-planar flexible multilayer reflector, or a reflective polarizer layer.

In another aspect, the present invention provides a graphic display device comprising the LED device according to the present invention.

In another aspect, the present invention provides an illumination device comprising the LED device according to the present invention.

In this application:

with regard to a stack of layers in a semiconductor device, "immediately adjacent" means next in sequence without intervening layers, "closely adjacent" means next in sequence with one or a few intervening layers, and "surrounding" means both before and after in sequence;

"potential well" means a layer of semiconductor in a semiconductor device which has a lower conduction band energy than surrounding layers or a higher valence band energy than surrounding layers, or both;

"quantum well" means a potential well which is sufficiently thin that quantization effects raise the electron-hole pair transition energy in the well, typically having a thickness of 100 nm or less;

"transition energy" means electron-hole recombination energy;

"lattice-matched" means, with reference to two crystalline materials, such as an epitaxial film on a substrate, that each material taken in isolation has a lattice constant, and that these lattice constants are substantially equal, typically not more than 0.2% different from each other, more typically not more than 0.1% different from each other, and most typically not more than 0.01% different from each other; and "pseudomorphic" means, with reference to a first crystalline layer of given thickness and a second crystalline layer, such as an epitaxial film and a substrate, that each layer taken in isolation has a lattice constant, and that these lattice constants are sufficiently similar so that the first layer, in the given thickness, can adopt the lattice spacing of the second layer in the plane of the layer substantially without misfit defects.

It should be understood that, for any embodiment of the present invention described herein comprising n-doped and p-doped semiconductor regions, a further embodiment should be considered as disclosed herein wherein n doping is exchanged with p doping and vice-versa.

It should be understood that, where each of "potential well," "first potential well," "second potential well" and "third potential well" are recited herein, a single potential well may be provided or multiple potential wells, which typically share similar properties, may be provided. Likewise, it should be understood that, where each of "quantum well," "first quantum well," "second quantum well" and "third quantum well" are recited herein, a single quantum well may be provided or multiple quantum wells, which typically share similar properties, may be provided.

DETAILED DESCRIPTION

Figure 1:
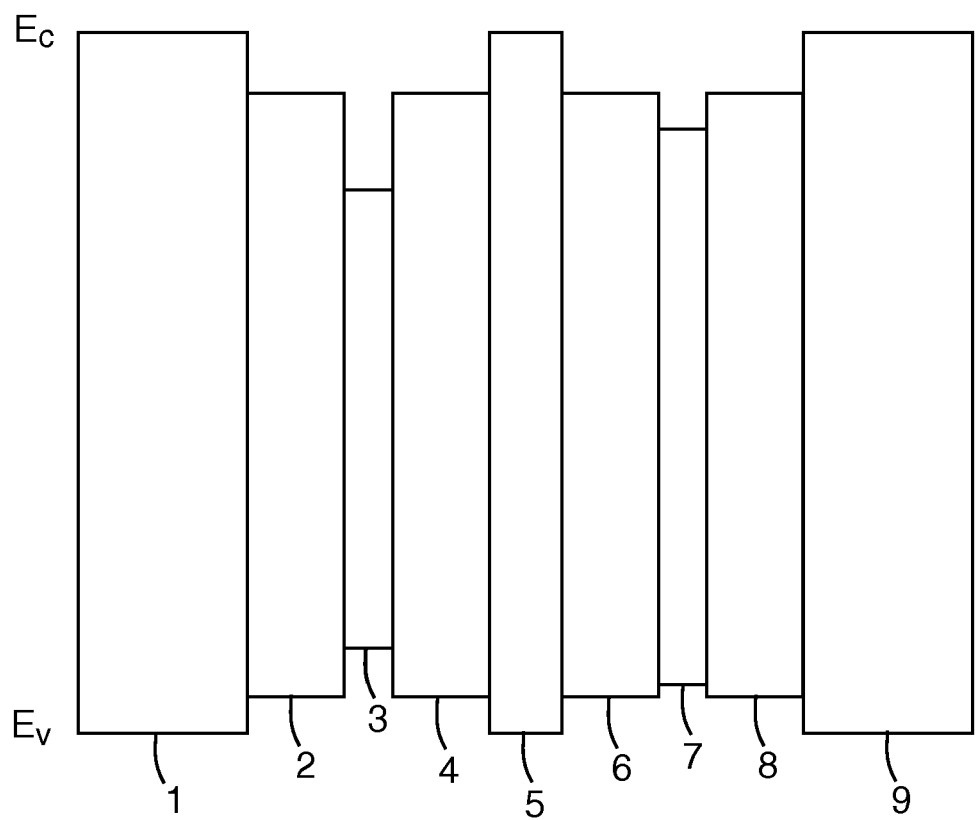
FIG. 1 is a flat-band diagram of conduction and valence bands of semiconductors in a construction according to one embodiment of the present invention. Layer thickness is not represented to scale.

The present invention provides a device comprising: an LED; a re-emitting semiconductor construction and a reflector positioned to reflect light emitted from the LED onto the re-emitting semiconductor construction. Typically the LED is capable of emitting light at a first wavelength and the a re-emitting semiconductor construction is capable of absorbing light at that first wavelength and re-emitting light at a second wavelength. The a re-emitting semiconductor construction comprises a potential well not located within a pn junction. The potential wells of the re-emitting semiconductor construction are typically but not necessarily quantum wells.

In another embodiment, the device comprises a reflector which transmits light at the first wavelength and reflects at least a portion of light at the second wavelength. This reflector may be positioned between the LED and the re-emitting semiconductor construction.

In typical operation, the LED emits photons in response to an electric current and the re-emitting semiconductor construction emits photons in response to the absorption of a portion of the photons emitted from the LED. In one embodiment, the re-emitting semiconductor construction additionally comprises an absorbing layer closely or immediately adjacent to the potential well. Absorbing layers typically have a band gap energy which is less than or equal to the energy of photons emitted by the LED and greater than the transition energy of the potential wells of the re-emitting semiconductor construction. In typical operation the absorbing layers assist absorption of photons emitted from the LED. In one embodiment, the re-emitting semiconductor construction additionally comprises at least one second potential well not located within a pn junction having a second transition energy not equal to the transition energy of the first potential well. In one embodiment, the LED is a UV LED. In one such embodiment, the re-emitting semiconductor construction comprises at least one first potential well not located within a pn junction having a first transition energy corresponding to blue-wavelength light, at least one second potential well not located within a pn junction having a second transition energy corresponding to green-wavelength light, and at least one third potential well not located within a pn junction having a third transition energy corresponding to red-wavelength light. In one embodiment, the LED is a visible light LED, typically a green, blue or violet LED, more typically a green or blue LED, and most typically a blue LED. In one such embodiment, the re-emitting semiconductor construction comprises at least one first potential well not located within a pn junction having a first transition energy corresponding to yellow- or green-wavelength light, more typically green-wavelength light, and at least one second potential well not located within a pn junction having a second transition energy corresponding to orange- or red-wavelength light, more typically red-wavelength light. The re-emitting semiconductor construction may comprise additional potential wells and additional absorbing layers.

Any suitable LED may be used in the practice of the present invention. Elements of the device according to the present invention, including the LED and the re-emitting semiconductor construction, may be composed of any suitable semiconductors, including Group IV elements such as Si or Ge (other than in light-emitting layers), III-V compounds such as InAs, AlAs, GaAs, InP, AlP, GaP, InSb, AlSb, GaSb, and alloys thereof, II-VI compounds such as ZnSe, CdSe, BeSe, MgSe, ZnTe, CdTe, BeTe, MgTe, ZnS, CdS, BeS, MgS and alloys thereof, or alloys of any of the above. Where appropriate, the semiconductors may be n-doped or p-doped by any suitable method or by inclusion of any suitable dopant. In one typical embodiment, the LED is a III-V semiconductor device and the re-emitting semiconductor construction is a II-VI semiconductor device.

Figure 2:
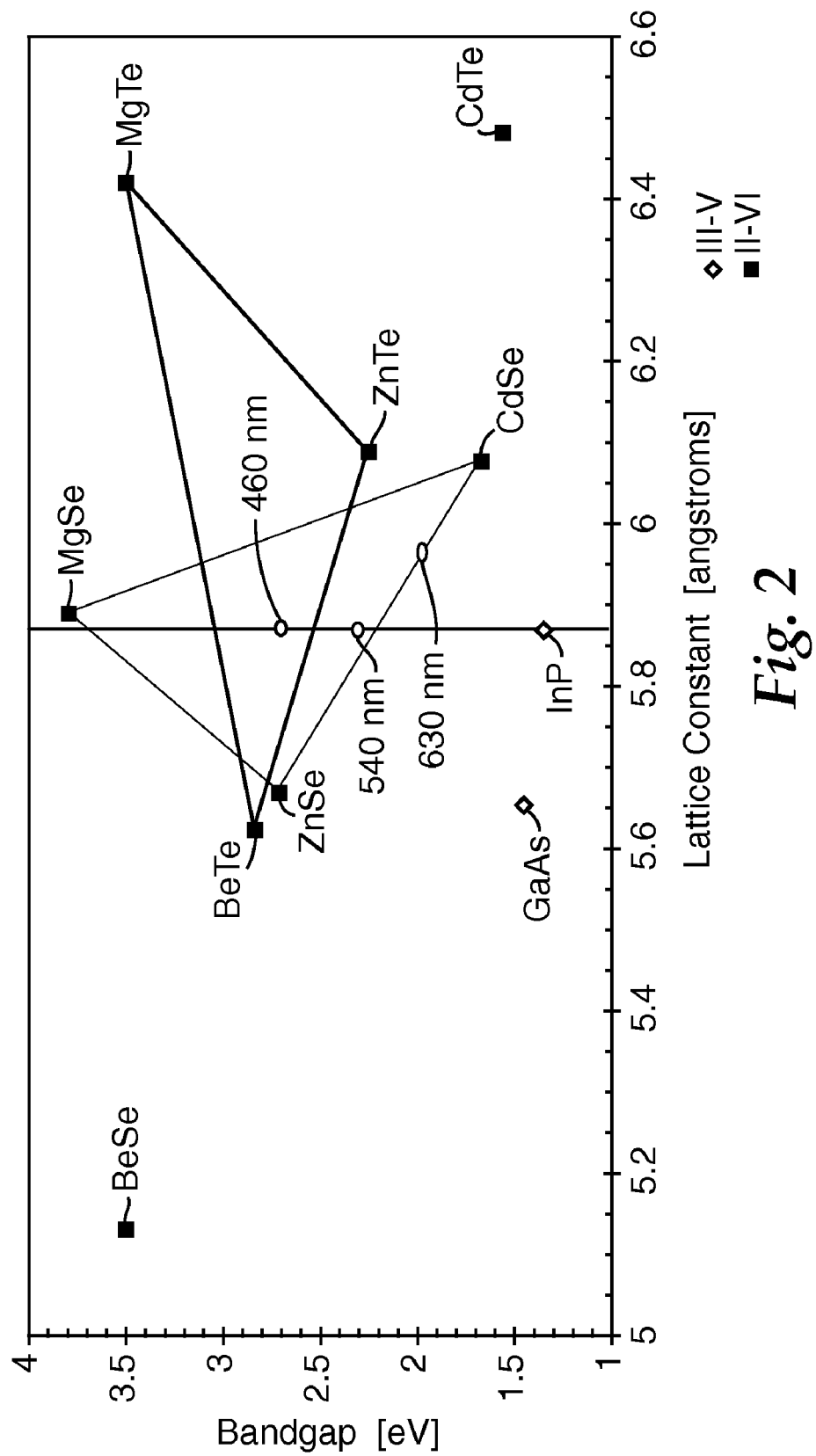
FIG. 2 is a graph indicating lattice constant and band gap energy for a variety of II-VI binary compounds and alloys thereof.

In one embodiment of the present invention, the compositions of the various layers of a component of the device, such the LED or the re-emitting semiconductor construction, are selected in light of the following considerations. Each layer typically will be pseudomorphic to the substrate at the thickness given for that layer or lattice matched to the substrate. Alternately, each layer may be pseudomorphic or lattice matched to immediately adjacent layers. Potential well layer materials and thicknesses are typically chosen so as to provide a desired transition energy, which will correspond to the wavelength of light to be emitted from the quantum well. For example, the points labeled 460 nm, 540 nm and 630 nm in FIG. 2 represent Cd(Mg)ZnSe alloys having lattice constants close to that for an InP substrate (5.8687 Angstroms or 0.58687 nm) and band gap energies corresponding to wavelengths of 460 nm (blue), 540 nm (green) and 630 nm (red). Where a potential well layer is sufficiently thin that quantization raises the transition energy above the bulk band gap energy in the well, the potential well may be regarded as a quantum well. The thickness of each quantum well layer will determine the amount of quantization energy in the quantum well, which is added to the bulk band gap energy to determine the transition energy in the quantum well. Thus, the wavelength associated with each quantum well can be tuned by adjustment of the quantum well layer thickness. Typically thicknesses for quantum well layers are between 1 nm and 100 nm, more typically between 2 nm and 35 nm. Typically the quantization energy translates into a reduction in wavelength of 20 to 50 nm relative to that expected on the basis of the band gap energy alone. Strain in the emitting layer may also change the transition energy for potential wells and quantum wells, including the strain resulting from the imperfect match of lattice constants between pseudomorphic layers.

Techniques for calculating the transition energy of a strained or unstrained potential well or quantum well are known in the art, e.g., in Herbert Kroemer, *Quantum Mechanics for Engineering Materials Science and Applied Physics* (Prentice Hall, Englewood Cliffs, N.J. 1994) at pp. 54-63; and Zory, ed., *Quantum Well Lasers* (Academic Press, San Diego, Calif., 1993) at pp. 72-79; both incorporated herein by reference.

Any suitable emission wavelengths may be chosen, including those in the infrared, visible, and ultraviolet bands. In one embodiment of the present invention, the emission wavelengths are chosen so that the combined output of light emitted by the device creates the appearance of any color that can be generated by the combination of two, three or more monochromatic light sources, including white or near-white colors, pastel colors, magenta, cyan, and the like. In another embodiment, the device according to the present invention emits light at an invisible infrared or ultraviolet wavelength and at a visible wavelength as an indication that the device is in operation. Typically the LED emits photons of the shortest wavelength, so that photons emitted from the LED have sufficient energy to drive the potential wells in the re-emitting semiconductor construction. In one typical embodiment, the LED is a III-V semiconductor device, such as a blue-emitting GaN-based LED, and re-emitting semiconductor construction is a II-VI semiconductor device.

FIG. 1 is a band diagram representing conduction and valence bands of semiconductors in a re-emitting semiconductor construction according to one embodiment of the present invention. Layer thickness is not represented to scale. Table I indicates the composition of layers 1-9 in this embodiment and the band gap energy ($E_g$) for that composition. This construction may be grown on an InP substrate.

TABLE I

| Layer | Composition | Band gap Energy ($E_g$) |
| --- | --- | --- |
| 1 | $Cd_{0.24}Mg_{0.43}Zn_{0.33}Se$ | 2.9 eV |
| 2 | $Cd_{0.35}Mg_{0.27}Zn_{0.38}Se$ | 2.6 eV |
| 3 | $Cd_{0.70}Zn_{0.30}Se$ | 1.9 eV |
| 4 | $Cd_{0.35}Mg_{0.27}Zn_{0.38}Se$ | 2.6 eV |
| 5 | $Cd_{0.24}Mg_{0.43}Zn_{0.33}Se$ | 2.9 eV |
| 6 | $Cd_{0.35}Mg_{0.27}Zn_{0.38}Se$ | 2.6 eV |
| 7 | $Cd_{0.33}Zn_{0.67}Se$ | 2.3 eV |
| 8 | $Cd_{0.35}Mg_{0.27}Zn_{0.38}Se$ | 2.6 eV |
| 9 | $Cd_{0.24}Mg_{0.43}Zn_{0.33}Se$ | 2.9 eV |

Layer 3 represents a single potential well which is a red-emitting quantum well having a thickness of about 10 nm. Layer 7 represents a single potential well which is a green-emitting quantum well having a thickness of about 10 nm. Layers 2, 4, 6 and 8 represent absorbing layers, each having a thickness of about 1000 nm. Layers 1, 5 and 9 represent support layers. Support layers are typically chosen so as to be substantially transparent to light emitted from quantum wells 3 and 7 and from short-wavelength LED 20. Alternately, the device may comprise multiple red- or green-emitting potential wells or quantum wells separated by absorbing layers and/or support layers.

Figure 3:
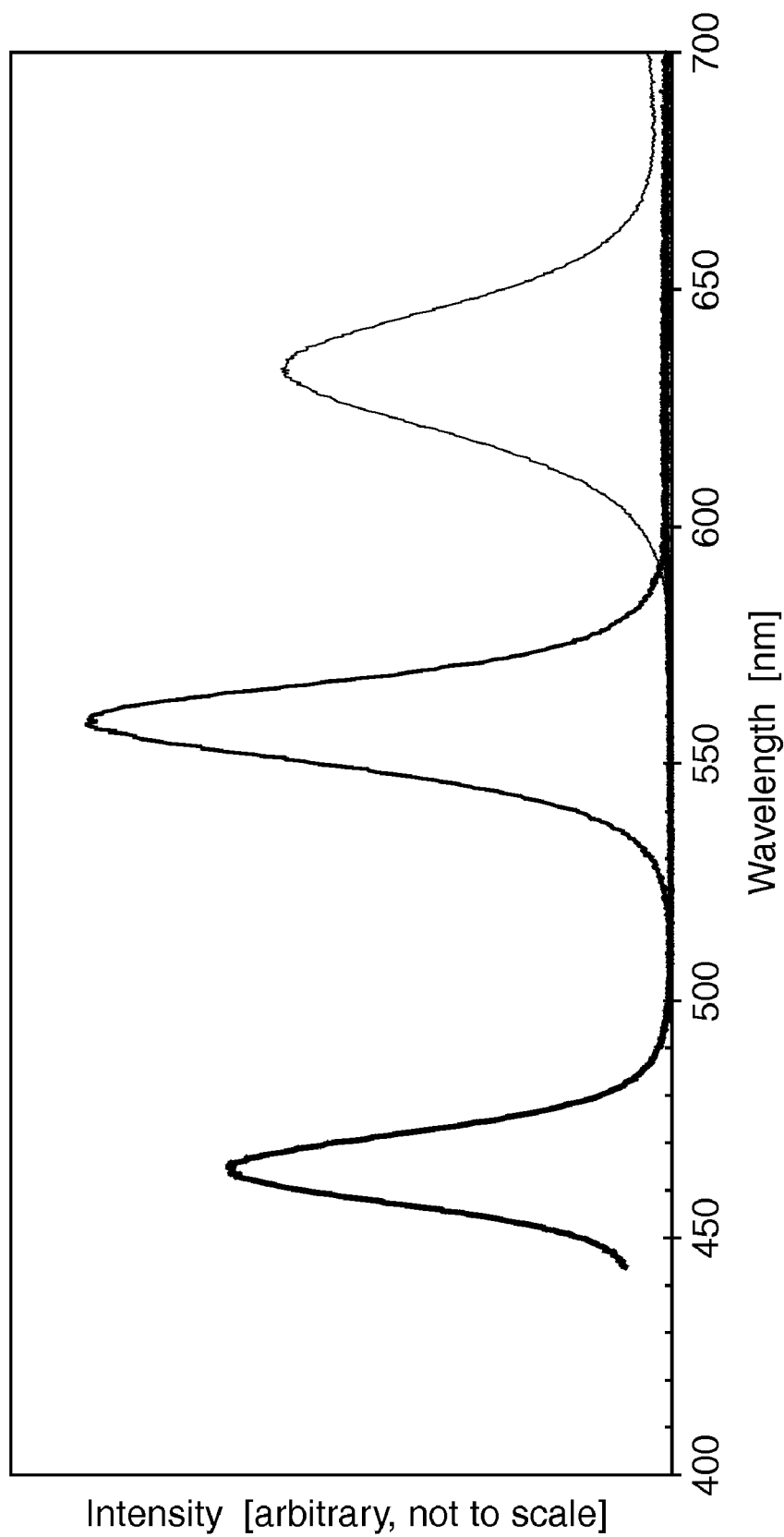
FIG. 3 is a graph representing the spectrum of light that emits from a device according to one embodiment of the present invention.

Without wishing to be bound by theory, it is believed that the embodiment of the present invention represented by FIG. 1 operates according to the following principles: Blue wavelength photons emitted by the LED and reflected upon the re-emitting semiconductor construction may be absorbed and re-emitted from the green-emitting quantum well 7 as green-wavelength photons or from the red-emitting quantum well 3 as red-wavelength photons. The absorption of a short-wavelength photon generates an electron-hole pair which may then recombine in the quantum wells, with the emission of a photon. The polychromatic combination of blue-, green- and red-wavelength light emitted from the device may appear white or near-white in color. The intensity of blue- and green- and red-wavelength light emitted from the device may be balanced in any suitable manner, including manipulation of the number of quantum wells of each type, the use of filters or reflective layers, and manipulation of the thickness and composition of absorbing layers. FIG. 3 represents a spectrum of light that emits from one embodiment of the device according to the present invention.

Again with reference to the embodiment represented by FIG. 1, absorbing layers 2, 4, 5 and 8 may be adapted to absorb photons emitted from the LED by selecting a band gap energy for the absorbing layers that is intermediate between the energy of photons emitted from the LED and the transition energies of quantum wells 3 and 7. Electron-hole pairs generated by absorption of photons in the absorbing layers 2, 4, 6 and 8 are typically captured by the quantum wells 3 and 7 before recombining with concomitant emission of a photon. Absorbing layers may optionally have a gradient in composition over all or a portion of their thickness, so as to funnel or direct electrons and/or holes toward potential wells.

In some embodiments of the present invention, the LED and the re-emitting semiconductor construction are provided in a single semiconductor unit. This semiconductor unit typically contains a first potential well located within a pn junction and a second potential well not located within a pn junction. The potential wells are typically quantum wells. The unit is capable of emitting light at two wavelengths, one corresponding to the transition energy of the first potential well and a second corresponding to the transition energy of the second potential well. In typical operation, the first potential well emits photons in response to an electric current passing through the pn junction and the second potential well emits photons in response to the absorption of a portion of the photons emitted from the first potential well. The semiconductor unit may additionally comprise one or more absorbing layers surrounding or closely or immediately adjacent to the second potential well. Absorbing layers typically have a band gap energy which is less than or equal to the transition energy of the first potential well and greater than that of the second potential well. In typical operation the absorbing layers assist absorption of photons emitted from the first potential well. The semiconductor unit may comprise additional potential wells, located within the pn junction or located not within the pn junction, and additional absorbing layers.

Figure 4:
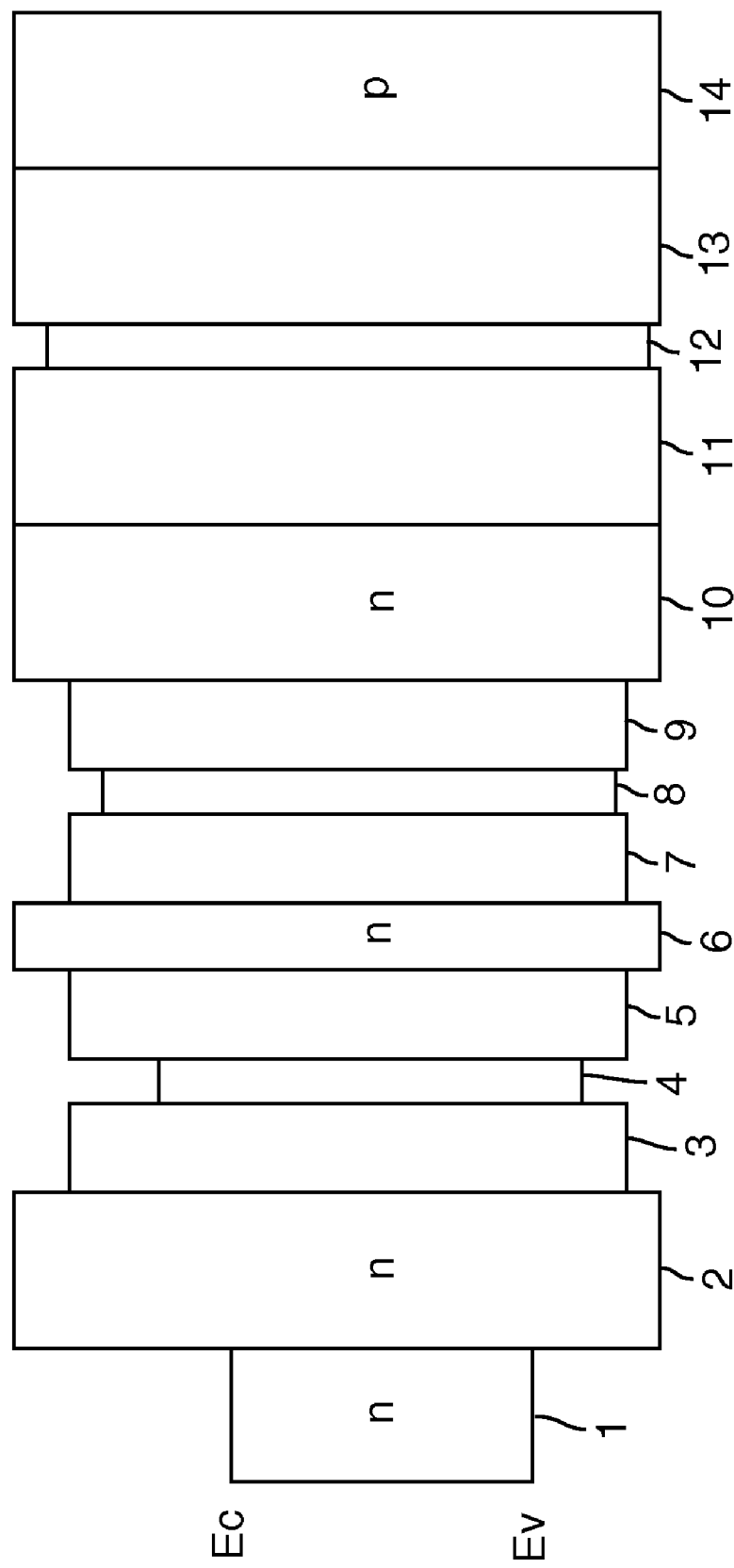
FIG. 4 is a flat-band diagram of conduction and valence bands of semiconductors in a construction according to one embodiment of the present invention. Layer thickness is not represented to scale.

FIG. 4 is a band diagram representing conduction and valence bands of semiconductors in such a semiconductor unit according to one embodiment of the present invention. Layer thickness is not represented to scale. Table II indicates the composition of layers 1-14 in this embodiment and the band gap energy ($E_g$) for that composition.

TABLE II

| Layer | Composition | Band gap Energy ($E_g$) |
|---|---|---|
| 1 | InP substrate | 1.35 eV |
| 2 | n-doped $Cd_{0.24}Mg_{0.43}Zn_{0.33}Se$ | 2.9 eV |
| 3 | $Cd_{0.35}Mg_{0.27}Zn_{0.38}Se$ | 2.6 eV |
| 4 | $Cd_{0.70}Zn_{0.30}Se$ | 1.9 eV |
| 5 | $Cd_{0.35}Mg_{0.27}Zn_{0.38}Se$ | 2.6 eV |
| 6 | n-doped $Cd_{0.24}Mg_{0.43}Zn_{0.33}Se$ | 2.9 eV |
| 7 | $Cd_{0.35}Mg_{0.27}Zn_{0.38}Se$ | 2.6 eV |
| 8 | $Cd_{0.33}Zn_{0.67}Se$ | 2.3 eV |
| 9 | $Cd_{0.35}Mg_{0.27}Zn_{0.38}Se$ | 2.6 eV |
| 10 | n-doped $Cd_{0.24}Mg_{0.43}Zn_{0.33}Se$ | 2.9 eV |

TABLE II-continued

| Layer | Composition | Band gap Energy ($E_g$) |
|---|---|---|
| 11 | undoped $Cd_{0.24}Mg_{0.43}Zn_{0.33}Se$ | 2.9 eV |
| 12 | $Cd_{0.31}Mg_{0.32}Zn_{0.37}Se$ | 2.7 eV |
| 13 | undoped $Cd_{0.24}Mg_{0.43}Zn_{0.33}Se$ | 2.9 eV |
| 14 | p-doped $Cd_{0.24}Mg_{0.43}Zn_{0.33}Se$ | 2.9 eV |

Layers 10, 11, 12, 13 and 14 represent a pn junction, or, more specifically, a pin junction, since intermediate undoped ("intrinsic" doping) layers 11, 12 and 13 are interposed between n-doped layer 10 and p-doped layer 14. Layer 12 represents a single potential well within the pn junction which is a quantum well having a thickness of about 10 nm. Alternately, the device may comprise multiple potential or quantum wells within the pn junction. Layers 4 and 8 represent second and third potential wells not within a pn junction, each being a quantum well having a thickness of about 10 nm. Alternately, the device may comprise additional potential or quantum wells not within the pn junction. In a further alternative, the device may comprise a single potential or quantum well not within the pn junction. Layers 3, 5, 7 and 9 represent absorbing layers, each having a thickness of about 1000 nm. Electrical contacts, not shown, provide a path for supply of electrical current to the pn junction. Electrical contacts conduct electricity and typically are composed of conductive metal. The positive electrical contact is electrically connected, either directly or indirectly through intermediate structures, to layer 14. The negative electrical contact is electrically connected, either directly or indirectly through intermediate structures, to one or more of layers 1, 2, 3, 4, 5, 6, 7, 8, 9 or 10.

Without wishing to be bound by theory, it is believed that this embodiment of the present invention operates according to the following principles: When an electrical current passes from layer 14 to layer 10, blue-wavelength photons are emitted from quantum well (12) in the pn junction. Photons traveling in the direction of layer 14 may leave the device. Photons traveling in the opposite direction may be absorbed and re-emitted from the second quantum well (8) as green-wavelength photons or from the third quantum well (4) as red-wavelength photons. The absorption of a blue-wavelength photon generates an electron-hole pair which may then recombine in the second or third quantum wells, with the emission of a photon. Green- or red-wavelength photons traveling in the direction of layer 14 may leave the device. The polychromatic combination of blue-, green- and red-wavelength light emitted from the device may appear white or near-white in color. The intensity of blue-, green- and red-wavelength light emitted from the device may be balanced in any suitable manner, including manipulation of the number of potential wells of each type and the use of filters or reflective layers. FIG. 3 represents a spectrum of light that emits from one embodiment of the device according to the present invention.

Again with reference to the embodiment represented by FIG. 4, absorbing layers 3, 5, 7 and 9 may be especially suitable to absorb photons emitted from the first quantum well (12), since they have a band gap energy that is intermediate between the transition energy of the first quantum well (12) and those of the second and third quantum wells (8 and 4). Electron-hole pairs generated by absorption of photons in the absorbing layers 3, 5, 7 and 9 are typically captured by the second or third quantum wells 8 and 4 before recombining with concomitant emission of a photon. Absorbing layers may optionally be doped, typically like to surrounding layers, which in this embodiment would be n-doping. Absorbing layers may optionally have a gradient in composition over all or a portion of their thickness, so as to funnel or direct electrons and/or holes toward potential wells.

Where the LED is a visible wavelength LED, the layers of the re-emitting semiconductor construction may be partially transparent to the light emitted from the LED. Alternately, such as where the LED is a UV wavelength LED, one or more of the layers of re-emitting semiconductor construction may block a greater portion or substantially or completely all of the light emitted from the LED, so that a greater portion or substantially or completely all of the light emitted from the device is light re-emitted from the re-emitting semiconductor construction. Where the LED is a UV wavelength LED, re-emitting semiconductor construction 10 may include red-, green- and blue-emitting quantum wells.

The device according to the present invention may comprise additional layers of conducting, semiconducting or non-conducting materials. Electrical contact layers may be added to provide a path for supply of electrical current to the LED. Light filtering layers may be added to alter or correct the balance of light wavelengths in the light emitted by the adapted LED.

In one embodiment, the device according to the present invention generates white or near-white light by emitting light at four principal wavelengths in the blue, green, yellow and red bands. In one embodiment, the device according to the present invention generates white or near-white light by emitting light at two principal wavelengths in the blue and yellow bands.

The device according to the present invention may comprise additional semiconductor elements comprising active or passive components such as resistors, diodes, zener diodes, capacitors, transistors, bipolar transistors, FET transistors, MOSFET transistors, insulated gate bipolar transistors, phototransistors, photodetectors, SCR's, thyristors, triacs, voltage regulators, and other circuit elements. The device according to the present invention may comprise an integrated circuit. The device according to the present invention may comprise a display panel or an illumination panel.

The LED and the re-emitting semiconductor construction which make up the device according to the present invention may be manufactured by any suitable method, which may include molecular beam epitaxy (MBE), chemical vapor deposition, liquid phase epitaxy and vapor phase epitaxy. The elements of the device according to the present invention may include a substrate. Any suitable substrate may be used in the practice of the present invention. Typical substrate materials include Si, Ge, GaAs, InP, sapphire, SiC and ZnSe. The substrate may be n-doped, p-doped, or semi-insulating, which may be achieved by any suitable method or by inclusion of any suitable dopant. Alternately, the elements of the device according to the present invention may be without a substrate. In one embodiment, elements of the device according to the present invention may be formed on a substrate and then separated from the substrate. The elements of the device according to the present invention may be joined together by any suitable method, including the use of adhesive or welding materials, pressure, heat or combinations thereof. Typically, the bond created is transparent. Bonding methods may include interfacial or edge bonding. Optionally, refractive index matching layers or interstitial spaces may be included.

Any suitable reflector may be used in the device of the present invention. Typically, a multilayer reflector is used, which may be a non-planar flexible multilayer reflector. Multilayer reflectors include polymeric multilayer optical films, i.e., films having tens, hundreds, or thousands of alternating layers of at least a first and second polymer material, whose thicknesses and refractive indices are selected to achieve a desired reflectivity in a desired portion of the spectrum, such as a reflection band limited to UV wavelengths or a reflection band limited to visible wavelengths. See, for example, U.S. Pat. No. 5,882,774 (Jonza et al.). Although reflection bands produced by these films also experience a blue-shift with incidence angle similar to the blue-shift associated with stacks of inorganic isotropic materials, the polymeric multilayer optical films can be processed so that adjacent layer pairs have matching or near-matching, or deliberately mismatched refractive indices associated with a z-axis normal to the film such that the reflectivity of each interface between adjacent layers, for p-polarized light, decreases slowly with angle of incidence, is substantially independent of angle of incidence, or increases with angle of incidence away from the normal. Hence, such polymeric multilayer optical films can maintain high reflectivity levels for p-polarized light even at highly oblique incidence angles, reducing the amount of p-polarized light transmitted by the reflective films compared to conventional inorganic isotropic stack reflectors. In order to achieve these properties, the polymer materials and processing conditions are selected so that, for each pair of adjacent optical layers, the difference in refractive index along the z-axis (parallel to the thickness of the film) is no more than a fraction of the refractive index difference along the x- or y- (in-plane) axes, the fraction being 0.5, 0.25, or even 0.1. Alternatively, the refractive index difference along the z-axis can be opposite in sign to the in-plane refractive index differences.

The use of polymeric multilayer optical films also makes available a variety of new embodiments and methods of construction due to the flexibility and formability of such films, whether or not they also have the refractive index relationships referred to above. For example, polymeric multilayer optical film can be permanently deformed by embossing, thermoforming, or other known means to have a 3-dimensional shape such as a portion of a paraboloid, a sphere, or an ellipsoid. See generally published application US 2002/0154406 (Merrill et al.). See also U.S. Pat. No. 5,540,978 (Schrenk) for additional polymeric multilayer film embodiments. Unlike conventional inorganic isotropic stacks, which are normally vapor deposited layer-by-layer onto a rigid, brittle substrate, polymeric multilayer optical films can be made in high volume roll form, and can also be laminated to other films and coated, and can be die cut or otherwise subdivided into small pieces for easy incorporation into an optical system as further explained below. Suitable methods of subdividing polymeric multilayer optical film are disclosed in pending U.S. application Ser. No. 10/268,118, filed Oct. 10, 2002.

A wide variety of polymer materials are suitable for use in multilayer optical films for LED-containing devices. However, particularly where the device comprises a white-light re-emitting semiconductor construction coupled with a UV LED excitation source, the multilayer optical film preferably comprises alternating polymer layers composed of materials that resist degradation when exposed to UV light. In this regard, a particularly preferred polymer pair is polyethylene terephthalate (PET)/co-polymethylmethacrylate (co-PMMA). The UV stability of polymeric reflectors can also be increased by the incorporation of non-UV absorbing light stabilizers such as hindered amine light stabilizers (HALS). In some cases the polymeric multilayer optical film can also include transparent metal or metal oxide layers. See e.g. PCT Publication WO 97/01778 (Ouderkirk et al.). In applications that use particularly high intensity UV light that would unacceptably degrade even robust polymer material combinations, it may be beneficial to use inorganic materials to form the multilayer stack. The inorganic material layers can be isotropic, or can be made to exhibit form birefringence as described in PCT Publication WO 01/75490 (Weber) and thus have the beneficial refractive index relationships that yield enhanced p-polarization reflectivity as described above. However, in most cases it is most convenient and cost effective for the multilayer optical film to be substantially completely polymeric, free of inorganic materials.

Figure 5:
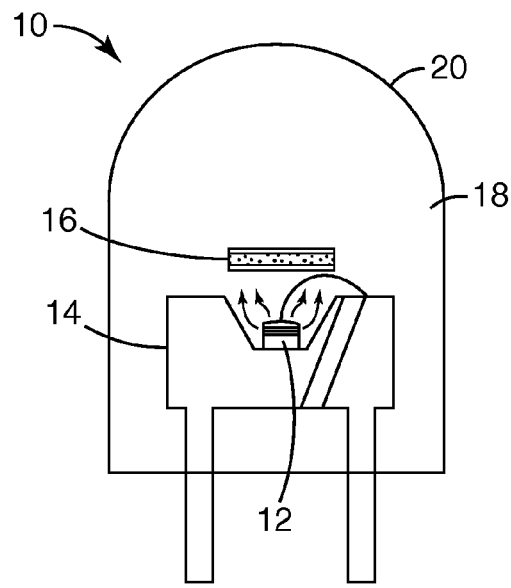
FIG. 5 is a schematic sectional view of a device according to the present disclosure.
Figure 6:
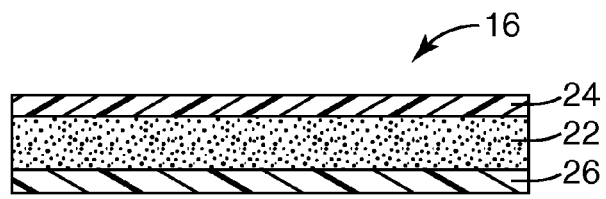
FIG. 6 is a sectional view of a re-emitting semiconductor construction and reflector assembly used in the device of FIG. 4.

FIGS. 5 and 6 depict one embodiment wherein re-emitting semiconductor construction 22 is may be combined with one or both of long-pass (LP) reflector 24 and short-pass (SP) reflector 26 (both are shown) to form a combined reflector-re-emitter construction 16. LP mirrors or filters based on scattering processes can achieve relatively constant performance as a function of incidence angle. LP and SP mirrors constructed from an inorganic dielectric material stack can have good spectral selectivity over a narrow range of incidence angles. The device 10 additionally includes LED 12 on mount 14 and may include capsule 18 with convex surface 20.

Where the LED and re-emitting semiconductor construction comprise a single semiconductor unit, only long-pass (LP) reflector 24 may be needed.

Figure 7:
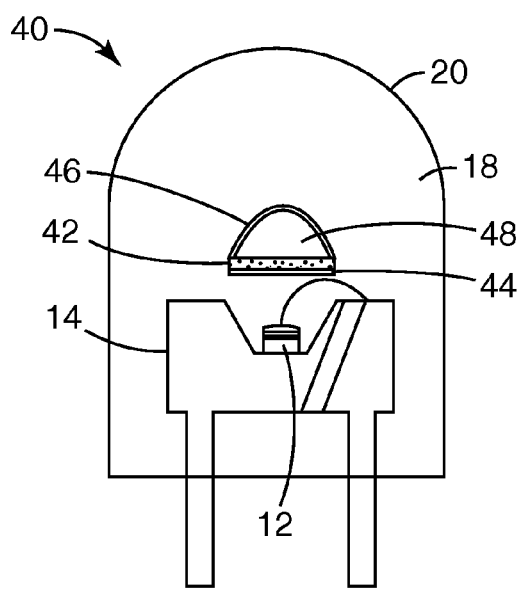
FIGS. 7-9 are schematic sectional views of alternative a devices according to the present disclosure.
Figure 8:
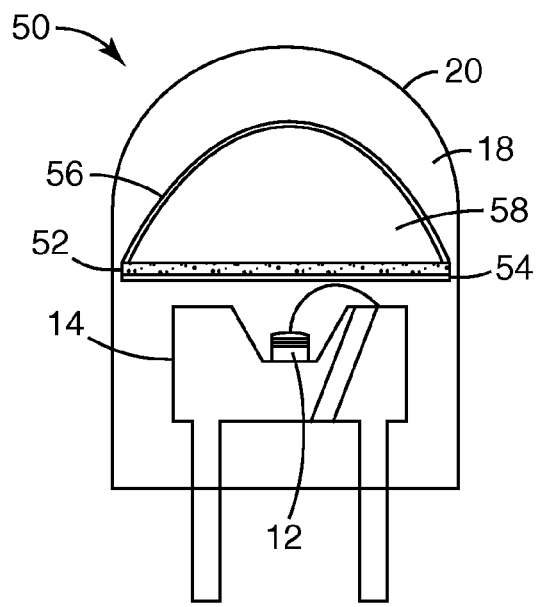
Figure 9:
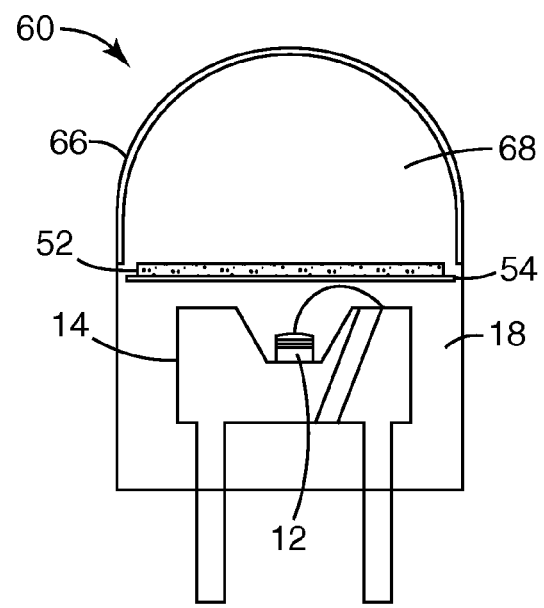

FIGS. 7-9 depict alternative constructions of device 40, 50, 60 utilizing a concave-shaped multilayer optical film LP reflector 46, 56. Spacing LP reflector 46, 56 away from the re-emitting semiconductor construction 42, 52 and curving it to present a concave surface to the re-emitting semiconductor construction 42, 52 and LED 12 helps reduce the range of incidence angles of excitation light impinging on the LP reflector 46, 56, thereby reducing the leakage of LED light through the LP reflector 46, 56 caused by its blue-shift effect. Preferably the multilayer optical film is permanently deformed by embossing or other suitable process into a concave surface of suitable shape before immersion in transparent medium 18. The multilayer optical films, whether LP or SP, are specular reflectors within their respective reflection bands. Diffuse reflection from a multilayer optical film is typically negligible.

In FIG. 7, device 40 includes a relatively small area re-emitting semiconductor construction layer 42 disposed on an optional SP reflector 44 composed of a polymeric multilayer optical film. LP reflector 46 has been embossed to acquire a concave shape and positioned next to the other components (42, 44) of the re-emitting semiconductor construction-reflector assembly. LED 12 and heat sink 14 are arranged to direct excitation light emitted by the LED toward the central portion of re-emitting semiconductor construction layer 42. Preferably, the excitation light has its highest fluence at or near the center of re-emitting semiconductor construction layer 42. Excitation light not absorbed in its initial traversal of re-emitting semiconductor construction layer 42 passes through a region 48 between LP reflector 46 and re-emitting semiconductor construction layer 42 before being reflected by LP reflector 46 back towards the re-emitting semiconductor construction layer. The region 48 can be composed of transparent potting material 18, or alternatively of another polymeric material, or air (or other gas), or glass. LP reflector 46 is preferably shaped to maximize the amount of excitation light reflected back to the re-emitting semiconductor construction.

FIG. 8 shows a device 50 similar to device 40, except that the size of the re-emitting semiconductor construction layer 52, SP reflector 54, and LP reflector 56 are increased. For a given distance from LED 12 to the re-emitting semiconductor construction layer, and the same heat sink 14 geometry, the larger LP reflector 56 will yield a higher concentration of light in the center of the re-emitting semiconductor construction layer. The smaller, central emitting area of the re-emitting semiconductor construction layer presents a smaller range of incidence angles of re-emitted light to the surface of the LP reflector, improving overall device efficiency. As before, region 58 can be composed of potting material 18 or another polymeric material, or air (or other gas), or glass.

Device 60, shown in FIG. 9, is similar to device 50, except the LP reflector 66 now forms an outer surface of the light source. Region 68 can be filled with potting material 18 or other transparent medium.

The re-emitting semiconductor construction layers of FIGS. 7-9 can be continuous, or patterned to limit the re-emitting semiconductor construction to where it is most effective. Moreover, in the embodiments of FIGS. 5 and 7-9 and other embodiments where the re-emitting semiconductor construction-reflector assembly is disposed above and spaced apart from the LED, the device can be manufactured in two halves: one containing the LED with heat sink, and the other containing the re-emitting semiconductor construction layer and multilayer reflector(s). The two halves can be made separately, and then be joined or otherwise secured together. This construction technique can help simplify manufacturing and increase overall yields.

Figure 10:
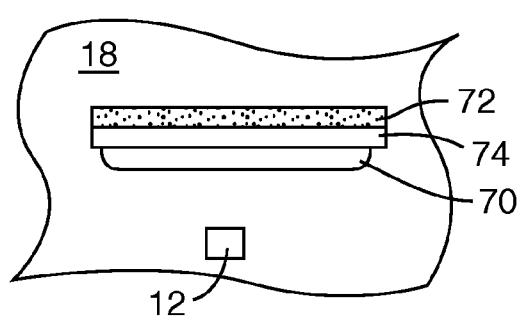
FIG. 10 depicts a portion of still another device according to the present disclosure.

FIG. 10 demonstrates a concept that can be applied beneficially to the other embodiments herein: providing an air gap between the LED and the re-emitting semiconductor construction layer, and/or providing an air gap proximate to one or more elements of the re-emitting semiconductor construction-reflector assembly. Only some elements of a device are shown in the figure for simplicity of description. An air gap 70 is shown between LED 12 and re-emitting semiconductor construction layer 72, adjacent multilayer optical film SP reflector 74. The air gap has a minimal detrimental effect on excitation light from the LED reaching the re-emitting semiconductor construction layer because of the relatively small angles involved. But the air gap enables total internal reflection (TIR) of light traveling at high incidence angles, such as light traveling in the SP reflector 74, the re-emitting semiconductor construction layer 72, and the LP reflector. In the embodiment of FIG. 10 the efficiency of the SP reflector 74 is enhanced by allowing TIR at the lower surface of reflector 74. Alternatively, SP reflector 74 can be eliminated and the air gap can be formed directly under re-emitting semiconductor construction layer 72. An air gap can also be formed at the upper side of re-emitting semiconductor construction layer 72, or adjacent to the LP reflector at its upper or lower surface. One approach for providing the air gap involves the use of known microstructured films. Such films have a substantially flat surface opposed to a microstructured surface. The microstructured surface can be characterized by a single set of linear v-shaped grooves or prisms, multiple intersecting sets of v-shaped grooves that define arrays of tiny pyramids, one or more sets of narrow ridges, and so forth. When the microstructured surface of such a film is placed against another flat film, air gaps are formed between the uppermost portions of the microstructured surface.

As the re-emitting semiconductor construction converts light of one wavelength (the excitation wavelength) to other wavelengths (the emitted wavelengths), heat may be produced. The presence of an air gap near the re-emitting semiconductor construction may significantly reduce heat transmission from the re-emitting semiconductor construction to surrounding materials. The reduced heat transfer can be compensated for in other ways, such as by providing a layer of glass or transparent ceramic near the re-emitting semiconductor construction layer that can remove heat laterally.

Figure 11:
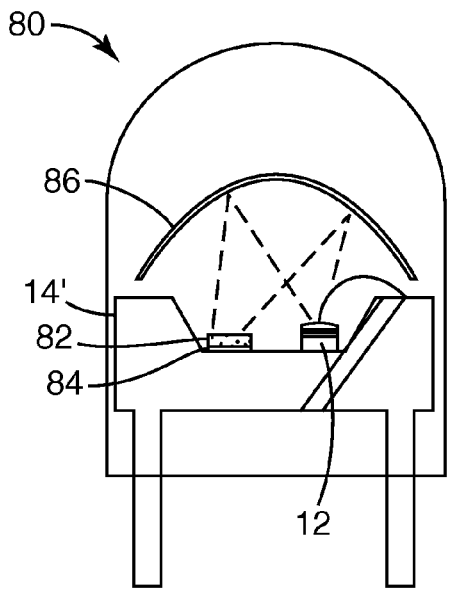
FIG. 11 is a schematic sectional view of still another device according to the present disclosure.

Still another approach of improving the efficiency of devices according to the present disclosure is to configure the LED, re-emitting semiconductor construction layer, and LP reflector such that at least some of the excitation light from the LED is reflected by the LP reflector directly onto the top (viewing) surface of the re-emitting semiconductor construction layer, rather than directing all of the excitation light onto the bottom surface of the re-emitting semiconductor construction layer. FIG. 11 shows such a device 80. The heat sink 14' has been modified from above embodiments so that the LED 12 and the re-emitting semiconductor construction layer 82 can be mounted generally co-planar. An SP reflector 84 is shown underneath the re-emitting semiconductor construction layer, but in many cases will not be required. This is because LP reflector 86, which has been embossed in the form of a concave ellipsoid or similar shape, directs UV excitation light directly from the LED onto the upper surface of re-emitting semiconductor construction layer 82, which surface faces the front of device 80. The LED and re-emitting semiconductor construction layer are preferably disposed at the foci of the ellipsoid. The visible light emitted by the re-emitting semiconductor construction layer is transmitted by LP reflector 86 and collected by the rounded front end of the device body to form the desired pattern or visible (preferably white) light.

Directing excitation light directly at the front surface of the re-emitting semiconductor construction layer has a number of benefits. The brightest portion of the re-emitting semiconductor construction layer—where the excitation light is the strongest—now is exposed at the front of the device rather than being obscured through the thickness of the re-emitting semiconductor construction layer. The re-emitting semiconductor construction layer can be made substantially thicker so that it absorbs substantially all of the UV excitation light, without concern for the thickness/brightness tradeoff referred to above. The re-emitting semiconductor construction can be mounted on a broadband metal mirror, including silver or enhanced aluminum.

Figure 12:
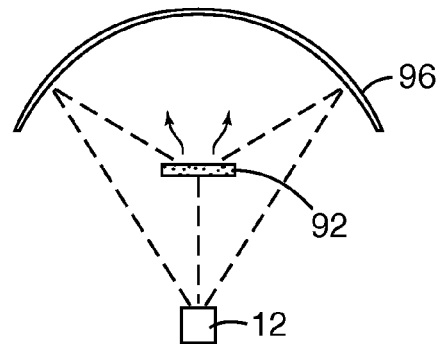
FIG. 12 is a schematic side view of another device that utilizes front surface illumination, as does the embodiment of FIG. 10.

FIG. 12 shows schematically another embodiment where the LED light impinges on the front surface of the re-emitting semiconductor construction layer, but wherein some of the LED light also impinges on the back surface. In this embodiment, some light emitted by LED 12 impinges on the back surface of re-emitting semiconductor construction layer 92, but some LED light also reflects off of the concave-shaped LP reflector 96 to strike the front surface of re-emitting semiconductor construction layer 92 without traversing through the re-emitting semiconductor construction. Visible light emitted by re-emitting semiconductor construction layer 92 then passes through the LP reflector 96 towards the viewer or object to be illuminated. The LED, re-emitting semiconductor construction layer, and LP reflector can all be immersed or attached to a transparent potting medium as shown in previous embodiments.

Figure 13:
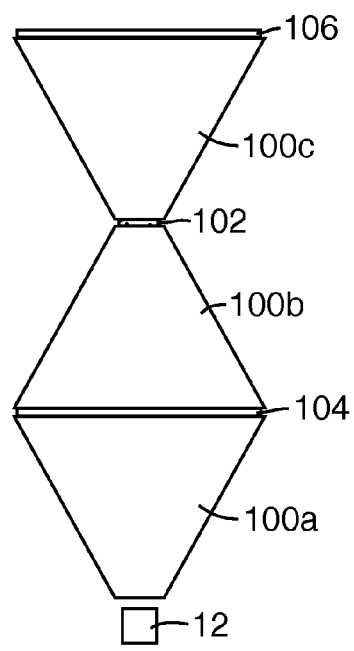
FIG. 13 is a schematic side view of a device that makes use of an arrangement of nonimaging concentrators.

FIG. 13 shows schematically another embodiment, wherein combinations of non-imaging concentrators are arranged to enhance the operation of the multilayer optical films. Specifically, concentrator elements 100a, 100b, 100c are provided as shown between the LED 12, SP reflector 104, re-emitting semiconductor construction layer 102, and LP reflector 106. The concentrator elements have the effect of reducing the angular spread of light impinging on the multilayer reflectors, thus reducing the blue-shift of the reflection band discussed above in connection with FIGS. 7-9. The concentrator elements may be in the form of simple conical sections with flat sidewalls, or the sidewalls can take on a more complex curved shape as is known to enhance collimation or focusing action depending on the direction of travel of the light. In any event the sidewalls of the concentrator elements are reflective and the two ends (one small, one large) are not. In FIG. 13, LED 12 is disposed at the small end of concentrator 100a. Concentrator element 100a collects a wide angular range of light emitted by the LED, which range is reduced by the time such light has traveled to the large end of concentrator element 100a, where SP reflector 104 is mounted. The SP reflector transmits the UV excitation light to concentrator element 100b, which concentrates such light onto re-emitting semiconductor construction layer 102 (while increasing the angular spread of the light). Wide angular range visible light emitted downwardly by re-emitting semiconductor construction layer 102 is converted by concentrator element 100b to a more narrow angular range at SP reflector 104, where it is reflected back up towards the re-emitting semiconductor construction layer 102. Meanwhile, excitation light that leaks through re-emitting semiconductor construction layer 102 and visible light emitted upwardly by re-emitting semiconductor construction layer 102 initially has a wide angular spread, but is converted by concentrator element 100c to a smaller angular spread so that LP reflector 106 will better transmit the visible light emitted by the re-emitting semiconductor construction and reflect the excitation light back towards the re-emitting semiconductor construction layer.

Figure 14:
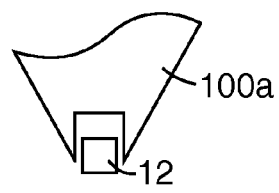
FIG. 14 is a close-up view of a portion of FIG. 12.

To capture as much LED excitation light as possible, the small end of concentrator element 100a can have a cavity so as to capture at least some light emitted by the sides of the LED, as shown in FIG. 14.

Further Discussion

The interference reflector described herein includes reflectors that are formed of organic, inorganic or a combination of organic and inorganic materials. The interference reflector can be a multilayer interference reflector. The interference reflector can be a flexible interference reflector. A flexible interference reflector can be formed from polymeric, non-polymeric materials, or polymeric and non-polymeric materials. Exemplary films including a polymeric and non-polymeric material are disclosed in U.S. Pat. Nos. 6,010,751 and 6,172,810 and EP 733,919A2, all incorporated by reference herein.

The interference reflector described herein can be formed from flexible, plastic, or deformable materials and can itself be flexible, plastic or deformable. These interference reflectors can be deflectable or curved to a radius usable with conventional LEDs, i.e., from 0.5 to 5 mm. These flexible interference reflectors can be deflected or curved and still retain its pre-deflection optical properties.

Known self-assembled periodic structures, such as cholesteric reflecting polarizers and certain block copolymers, are considered to be multilayer interference reflectors for purposes of this application. Cholesteric mirrors can be made using a combination of left and right handed chiral pitch elements.

In an illustrative embodiment, a long-pass filter that partially transmits all wavelengths of blue light can be used in combination with a thin yellow re-emitting semiconductor construction layer in order to direct some blue light from the LED back onto the re-emitting semiconductor construction layer after the first pass through the re-emitting semiconductor construction.

In addition to providing reflection of UV light, a function of the multilayer optical film can be to block transmission of UV light so as to prevent degradation of subsequent elements inside or outside the LED package, including prevention of human eye damage. In some embodiments, it may be advantageous to incorporate a UV absorber on the side of the UV reflector furthest away from the LED. This UV absorber can be in, on, or adjacent to the multilayer optical film.

Although a variety of methods are known in the art for producing interference filters, an all polymer construction can offer several manufacturing and cost benefits. If high temperature polymers with high optical transmission and large index differentials are utilized in the of an interference filter, then an environmentally stable filter that is both thin and very flexible can be manufactured to meet the optical needs of short-pass (SP) and (LP) filters. In particular, coextruded multilayer interference filters as taught in U.S. Pat. No. 6,531,230 (Weber et al.) can provide precise wavelength selection as well as large area, cost effective manufacturing. The use of polymer pairs having high index differentials allows the construction of very thin, highly reflective mirrors that are free-standing, i.e. have no substrate but are still easily processed. Such interference structures will not crack or shatter or otherwise degrade either when thermoformed or when flexed to a radius of curvature as small as 1 mm.

An all polymeric filter can be thermoformed into various 3D shapes such as e.g. hemispherical domes (as described below). However, care must be taken to control the thinning to the correct amount over the entire surface of the dome to create the desired angular performance. Filters having a simple two dimensional curvature are easier to create than 3D, compound shaped filters. In particular, any thin and flexible filter can be bent into a 2D shaped such as e.g. a part of a cylinder, in this case an all polymeric filter is not needed. Multilayer inorganic filters on thin polymeric substrates can be shaped in this manner, as well as can inorganic multilayers on glass substrates that are less than 200 microns in thickness. The latter may have to be heated to temperatures near the glass transition point to obtain a permanent shape with low stress.

Optimum bandedges for long and short pass filters will depend on the emission spectra of both the LED and the re-emitting semiconductor construction in the system the filters are designed to operate in. In an illustrative embodiment, for a short pass filter, substantially all of the LED emission passes through the filter to excite the re-emitting semiconductor construction, and substantially all of the emissions of the re-emitting semiconductor construction are reflected by the filter so they do not enter the LED or its base structure where they could be absorbed. For this reason, the short pass defining bandedge is placed in a region between the average emission wavelength of the LED and the average emission wavelength of the re-emitting semiconductor construction. In an illustrative embodiment, the filter is placed between the LED and the re-emitting semiconductor construction. If however, the filter is planar, the emissions from a typical LED will strike the filter at a variety of angles, and at some angle of incidence be reflected by the filter and fail to reach the re-emitting semiconductor construction. Unless the filter is curved to maintain a nearly constant angle of incidence, one may desire to place the design bandedge at a wavelength larger than the midpoint of the re-emitting semiconductor construction and LED emission curves to optimize the overall system performance. In particular, very little of the emission of the re-emitting semiconductor construction is directed to the filter near zero degrees angle of incidence because the included solid angle is very small.

In another illustrative embodiment, long pass reflective filters are placed opposite the re-emitting semiconductor construction layer from the LED in order to recycle the LED excitation light back to the re-emitting semiconductor construction in order to improve system efficiency. In the illustrative embodiment, a long pass filter may be omitted if the LED emissions are in the visible spectrum and large amounts are needed to balance the re-emitting semiconductor construction color output. However, a long pass filter that partially transmits the shortwave light, such as e.g. blue light, can be used to optimize the angular performance of a blue-LED/yellow-re-emitting semiconductor construction system via the spectral angle shift that would pass more blue light at higher angles than at normal incidence.

In a further illustrative embodiment, the LP filter is curved, in order to maintain a nearly constant angle of incidence of the LED emitted light on the filter. In this embodiment, the re-emitting semiconductor construction and the LED both face one side of the LP filter. At high angles of incidence, the LP filter will not reflect the shortwave light. For this reason, the long wave bandedge of the LP filter can be placed at as long a wavelength as possible while blocking as little of the emission of the re-emitting semiconductor construction as possible. Again, the bandedge placement can be changed to optimize the overall system efficiency.

The term "adjacent" is defined herein to denote a relative positioning of two articles that are near one another. Adjacent items can be touching, or spaced away from each other with one or more materials disposed between the adjacent items.

LED excitation light can be any light that an LED source can emit. LED excitation light can be UV, or blue light. Blue light also includes violet and indigo light. LEDs include spontaneous emission devices as well as devices using stimulated or super radiant emission including laser diodes and vertical cavity surface emitting laser diodes.

Layers of re-emitting semiconductor construction described herein can be a continuous or discontinuous layer. The layers of re-emitting semiconductor construction material can be a uniform or non-uniform pattern. The layer of re-emitting semiconductor construction material can be plurality of regions having a small area. In an illustrative embodiment, the plurality of regions can each be formed from a re-emitting semiconductor construction which emits visible light at one or more different wavelengths such as, for example, a region emitting red, a region emitting blue, and a region emitting green. The regions emitting visible light at a plurality of wavelengths can be arranged and configured in any uniform or non-uniform manner as desired. For example, the layer of re-emitting semiconductor construction material can be a plurality of regions with a non-uniform density gradient along a surface or an area. The regions can have any regular or irregular shape.

Structured re-emitting semiconductor construction layers can be configured in several ways to provide benefits in performance, as described below. When multiple types of re-emitting semiconductor construction are used to provide broader or fuller spectral output, light from shorter wavelength re-emitting semiconductor constructions can be re-absorbed by other re-emitting semiconductor constructions. Patterns comprising isolated lines or isolated regions of each re-emitting semiconductor construction type reduce the amount of re-absorption. This would be particularly effective in cavity type constructions where unabsorbed pump light is reflected back to the re-emitting semiconductor construction pattern.

Embodiments are disclosed herein where a first optical component comprising a re-emitting semiconductor construction/reflector assembly can be later attached to an LED base; a heat sink can optionally include a transparent heat sink to which the re-emitting semiconductor construction layer and interference filter may be attached. The transparent heat sink can be a layer of sapphire disposed between the re-emitting semiconductor construction layer/interference filter and the LED base. Most glasses have a higher thermal conductivity than polymers and can be useful in this function as well. Many other crystalline material's thermal conductivities are higher than most glasses and can be used here also. The sapphire layer can be contacted at the edges by a metal heat sink.

The lifetime of an SP or LP filter is preferably greater than or equal to the lifetime of the LED in the same system. The degradation of a polymeric interference filter can be due to overheating which can cause material creep which changes the layer thickness values and therefore the wavelengths that the filter reflects. In the worst case, overheating can cause the polymer materials to melt, resulting in rapid flow of material and change in wavelength selection as well as inducing non-uniformities in the filter.

Degradation of polymer materials can also be induced by short wavelength (actinic) radiation such as blue, violet or UV radiation, depending on the polymer material. The rate of degradation is dependent both on the actinic light flux and on the temperature of the polymer. Both the temperature and the flux will in general, decrease with increasing distance from the LED. Thus it is advantageous in cases of high brightness LEDs, particularly UV LEDs, to place a polymeric filter as far from the LED as the design can allow. Placement of the polymer filter on a transparent heat sink as described above can also improve the lifetime of the filter. For domed filters, the flux of actinic radiation decreases as the square of the distance from the LED. For example, a hemispherical MOF reflector with a 1 cm radius, placed with a unidirectional 1 watt LED at the center of curvature, would experience an average intensity of $1/(2\pi)$ Watts/cm$^2$ (surface area of the dome=$2\pi$ cm$^2$). At a 0.5 cm radius, the average intensity on the dome would be four times of that value, or $2/\pi$ W/cm$^2$. The system of LED, re-emitting semiconductor construction, and multilayer optical film can be designed with light flux and temperature control taken into consideration.

A reflective polarizer can be disposed adjacent the multilayer reflector and/or adjacent the re-emitting semiconductor construction material. The reflective polarizer allows light of a preferred polarization to be emitted, while reflecting the other polarization. The re-emitting semiconductor construction layer and other film components known in the art can depolarize the polarized light reflected by reflective polarizer, and either by the reflection of the re-emitting semiconductor construction layer, or re-emitting semiconductor construction layer in combination with the multilayer reflector, light can be recycled and increase the polarized light brightness of the solid state light device (LED). Suitable reflective polarizers include, for example, cholesteric reflective polarizers, cholesteric reflective polarizers with a ¼ wave retarder, DBEF reflective polarizer available from 3M Company or DRPF reflective polarizer also available from 3M Company. The reflective polarizer preferably polarizes light over a substantial range of wavelengths and angles emitted by the re-emitting semiconductor construction, and in the case where the LED emits blue light, may reflect the LED emission wavelength range as well.

Suitable multilayer reflector films are birefringent multilayer optical films in which the refractive indices in the thickness direction of two adjacent layers are substantially matched and have a Brewster angle (the angle at which reflectance of p-polarized light goes to zero) which is very large or is nonexistent. This allows for the construction of multilayer mirrors and polarizers whose reflectivity for p-polarized light decreases slowly with angle of incidence, are independent of angle of incidence, or increase with angle of incidence away from the normal. As a result, multilayer films having high reflectivity (for both planes of polarization for any incident direction in the case of mirrors, and for the selected direction in the case of polarizers) over a wide bandwidth, can be achieved. These polymeric multilayer reflectors include alternating layers of a first and second thermoplastic polymer. The alternating layers defining a local coordinate system with mutually orthogonal x- and y-axes extending parallel to the layers and with a z-axis orthogonal to the x- and y-axes, and wherein at least some of the layers are birefringent. The absolute value of the difference in indices of refraction between the first and second layers is $\Delta x$, $\Delta y$, and $\Delta z$ respectively, for light polarized along first, second, and third mutually orthogonal axes. The third axis is orthogonal to the plane of the film where $\Delta x$ is greater than about 0.05, and where $\Delta z$ is less than about 0.05. These films are described, for example, in U.S. Pat. No. 5,882,774, which is incorporated by reference herein.

Figure 15:
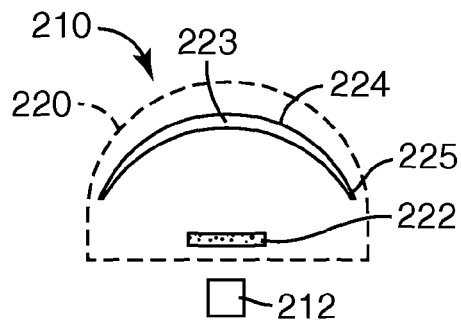
FIGS. 15-19 are schematic sectional views of other embodiments of the present disclosure.

FIG. 15 is a schematic sectional view of another embodiment of the present disclosure, device 210. A non-planar multilayer reflector 224 is shown adjacent a of re-emitting semiconductor construction 222, however the non-planar multilayer reflector 224 need only be positioned such that light can travel between the re-emitting semiconductor construction 222 and the multilayer reflector 224. The non-planar multilayer reflector 224 reflects LED excitation light excitation light such as, for example UV, or blue light and transmits visible light. This non-planar multilayer reflector 224 can be referred to as a long-pass (LP) reflector, as described above. The above arrangement can be disposed within an optically transparent material 220.

The non-planar multilayer reflector 224 can be positioned to receive light from an LED 212, as discussed herein. The non-planar multilayer reflector 224 can be any useable thickness. The non-planar polymeric multilayer reflector 224 can be 5 to 200 micrometers thick or 10 to 100 micrometers thick. The non-planar multilayer reflector 224 can optionally be substantially free of inorganic materials.

The non-planar multilayer reflector 224 can be formed of a material that resists degradation when exposed to UV, blue or violet light such, as discussed herein. The multilayer reflectors discussed herein can be stable under high intensity illumination for extended periods of time. High intensity illumination can be generally defined as a flux level from 1 to 100 Watt/cm$^2$. Operating temperatures at the interference reflectors can be 100° C. or less, or 65° C. or less. Suitable illustrative polymeric materials can include UV resistant material formed from, for example, acrylic material, PET material, PMMA material, polystyrene material, polycarbonate material, THV material available from 3M (St. Paul, Minn.), and combinations thereof. These materials and PEN material can be used for blue excitation light.

The non-planar multilayer reflector 224 can have a non-uniform thickness or thickness gradient along its length, width, or both. The non-planar multilayer reflector 224 can have a first thickness at an inner region 223 of the non-planar multilayer reflector 224 and a second thickness at an outer region 225 of the non-planar multilayer reflector 224. The difference in thickness across the surface of the reflector is associated with a corresponding difference or shift in spectral reflectance, with the thinner areas being blue-shifted relative to the thicker areas. There are a variety of ways that thickness gradients can be created. For example, thickness gradients can be formed by thermoforming, embossing, laser embossing, or extrusion, to list a few.

As shown in FIG. 15 the inner region 223 thickness can be greater than the outer region 225 thickness. Increasing the inner region 223 thickness can reduce an undesirable effect know as the "halo effect". The "halo effect" is a problem known in industry where the balance of blue excitation light and yellow converted light changes as a function of viewing angle of the LED. Here, the inner region 223 thickness can be greater than the outer region 225 thickness so as to reduce on-axis blue transmission.

Figure 16:
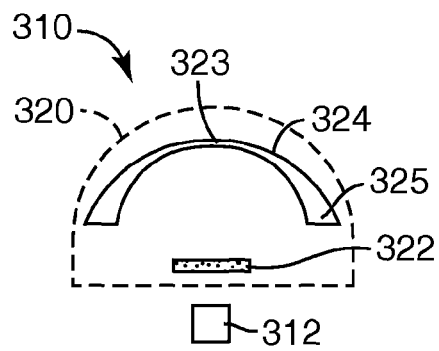

As shown in FIG. 16, the outer region 325 thickness can be greater than the inner region 323 thickness. The above arrangement can be disposed within an optically transparent material 320.

The non-planar multilayer reflector can be positioned in any usable configuration with the LED, as described herein. In an illustrative embodiment, the non-planar multilayer reflector is positioned between the re-emitting semiconductor construction and the LED (see e.g., FIG. 17). In another illustrative embodiment, the re-emitting semiconductor construction is positioned between the non-planar multilayer reflector and the LED (see e.g., FIGS. 15, 16).

The non-planar multilayer reflector 224/324 can be configured to reflect UV or blue light and transmit at least a portion of the visible light spectrum such as green, yellow, or red light. In another illustrative embodiment, the non-planar multilayer reflector 224/324 can be configured to reflect UV, blue or green light and transmit at least a portion of the visible light spectrum such as yellow or red light.

The re-emitting semiconductor construction 222/322 is capable of emitting visible light when illuminated with excitation light emitted from an LED 212/312. The re-emitting semiconductor construction material can be any useable thickness.

Figure 17:
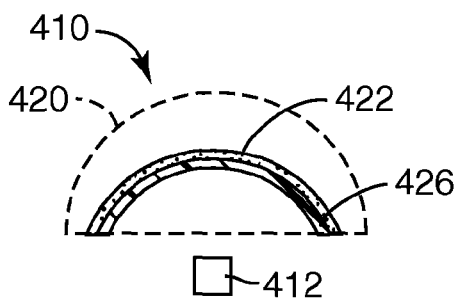

FIG. 17 is a schematic sectional view of another embodiment of the present device 410. A non-planar multilayer reflector 426 is shown adjacent a re-emitting semiconductor construction 422, however the non-planar multilayer reflector 426 need only be positioned such that light can travel between the re-emitting semiconductor construction 422 and the non-planar multilayer reflector 426. The non-planar multilayer reflector 426 reflects visible light and transmits LED excitation light such as, for example UV, or blue light. This non-planar multilayer reflector 426 can be referred to as a short-pass (SP) reflector, as described above. The above arrangement can be disposed within an optically transparent material 420.

The non-planar multilayer reflector 426 may include the same materials and be formed in a similar manner as the non-planar multilayer reflector 424 described above. The re-emitting semiconductor construction layer 422 is also described above.

The non-planar multilayer reflector 426 can be positioned in any usable configuration with the LED 412 as described herein. In an illustrative embodiment shown as FIG. 17, the non-planar multilayer reflector 426 is positioned between the re-emitting semiconductor construction 422 and the LED 412. In another illustrative embodiment, the re-emitting semiconductor construction 422 is positioned between the non-planar multilayer reflector 426 and the LED 412. In an illustrative embodiment, non-planar multilayer reflector 426 is a hemispherical concave shape facing toward the LED 412. Such a design allows light emitted by the LED 412 to strike the non-planar multilayer reflector 426 at a normal or a near normal incidence angle. The non-planar geometry of the multilayer reflector 426 allows substantially all short wave light to pass through the non-planar multilayer reflector 426 no matter what side or direction it emanates from the LED 412.

Figure 18:
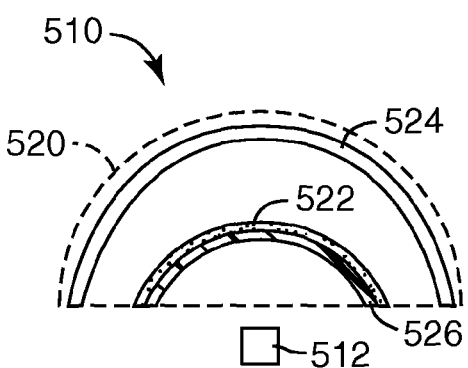

FIG. 18 is a schematic sectional view of another embodiment of the present device 510. A first non-planar multilayer reflector 524 is shown spaced away from a re-emitting semiconductor construction 522, however the first non-planar multilayer reflector 524 need only be positioned such that light can travel between the re-emitting semiconductor construction 522 and the first non-planar multilayer reflector 524. The first non-planar multilayer reflector 524 reflects LED excitation light such as, for example UV, or blue light and transmits visible light. This first non-planar multilayer reflector 524 can be referred to as a long-pass (LP) reflector, as described above. The above arrangement can be disposed within an optically transparent material 520.

A second non-planar multilayer reflector 526 is shown adjacent a re-emitting semiconductor construction material 22, however the second non-planar multilayer reflector 526 need only be positioned such that light can travel between the re-emitting semiconductor construction material 522 and the second non-planar multilayer reflector 526. The second non-planar multilayer reflector 526 reflects visible light and transmits LED excitation light such as, for example UV, or blue light. This second non-planar multilayer reflector 526 can be referred to as a short-pass (SP) reflector, as described above.

A re-emitting semiconductor construction 522 is shown disposed between the first non-planar polymeric multilayer reflector 524 and the second non-planar polymeric multilayer reflector 526. The re-emitting semiconductor construction 522 is described above.

Figure 19:
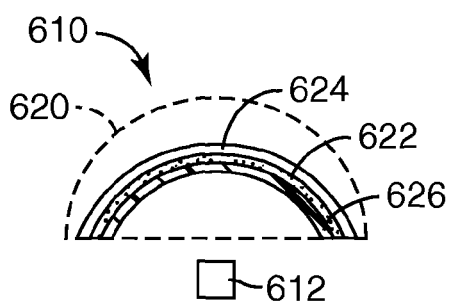

FIG. 19 is a schematic sectional view of another embodiment of the present device 610. A first non-planar multilayer reflector 624 is shown adjacent a re-emitting semiconductor construction material 622, however the first non-planar multilayer reflector 624 need only be positioned such that light can travel between the re-emitting semiconductor construction material 622 and the first non-planar multilayer reflector 624. The first non-planar multilayer reflector 624 reflects LED excitation light excitation light such as, for example UV, or blue light and transmits visible light. This first non-planar multilayer reflector 624 can be referred to as a long-pass (LP) reflector, as described above. The above arrangement can be disposed within an optically transparent material 620.

A second non-planar multilayer reflector 626 is shown adjacent a re-emitting semiconductor construction material 622, however the second non-planar multilayer reflector 626 need only be positioned such that light can travel between the re-emitting semiconductor construction material 622 and the second non-planar multilayer reflector 626. The second non-planar multilayer reflector 626 reflects visible light and transmits LED excitation light such as, for example UV, or blue light. This second non-planar multilayer reflector 626 can be referred to as a short-pass (SP) reflector, as described above.

A re-emitting semiconductor construction layer 622 is shown disposed between the first non-planar multilayer reflector 624 and the second non-planar multilayer reflector 626. The re-emitting semiconductor construction 622 is described above.

The device according to the present invention may be a component or the critical component of a graphic display device such as a large- or small-screen video monitor, computer monitor or display, television, telephone device or telephone device display, personal digital assistant or personal digital assistant display, pager or pager display, calculator or calculator display, game or game display, toy or toy display, large or small appliance or large or small appliance display, automotive dashboard or automotive dashboard display, automotive interior or automotive interior display, marine dashboard or marine dashboard display, marine interior or marine interior display, aeronautic dashboard or aeronautic dashboard display, aeronautic interior or aeronautic interior display, traffic control device or traffic control device display, advertising display, advertising sign, or the like.

The device according to the present invention may be a component or the critical component of a liquid crystal display (LCD), or like display, as a backlight to that display. In one embodiment, the semiconductor device according to the present invention is specially adapted for use a backlight for a liquid crystal display by matching the colors emitted by the semiconductor device according to the present invention to the color filters of the LCD display.

The device according to the present invention may be a component or the critical component of an illumination device such as a free-standing or built-in lighting fixture or lamp, landscape or architectural illumination fixture, handheld or vehicle-mounted lamp, automotive headlight or taillight, automotive interior illumination fixture, automotive or non-automotive signaling device, road illumination device, traffic control signaling device, marine lamp or signaling device or interior illumination fixture, aeronautic lamp or signaling device or interior illumination fixture, large or small appliance or large or small appliance lamp, or the like; or any device or component used as a source of infrared, visible, or ultraviolet radiation.

Various modifications and alterations of this invention will become apparent to those skilled in the art without departing from the scope and principles of this invention, and it should be understood that this invention is not to be unduly limited to the illustrative embodiments set forth hereinabove.

I claim:

1. A device comprising:
   a) an LED capable of emitting light at a first wavelength;
   b) a re-emitting semiconductor construction which comprises at least one potential well not located within a pn junction; and an absorbing layer having a band gap energy less than or equal to an energy of a photon emitted by the LED and greater than a transition energy of the at least one potential well; and
   c) a reflector positioned to reflect light emitted from the LED onto the re-emitting semiconductor construction.

2. The device according to claim 1 wherein the absorbing layer is closely adjacent or immediately adjacent to at least one of said at least one potential well.

3. The device according to claim 1 wherein at least one potential well in the at least one potential well includes a quantum well.

4. The device according to claim 1, wherein the reflector is a multilayer reflector.

5. The device according to claim 1, wherein the reflector is a non-planar flexible multilayer reflector.

6. The device according to claim 1, wherein the reflector is a reflective polarizer layer.

7. A graphic display device comprising the device according to claim 1.

8. An illumination device comprising the device according to claim 1.

9. The device according to claim 1, wherein the re-emitting semiconductor construction is capable of emitting light at a second wavelength in response to an absorption of light at the first wavelength; and wherein the reflector reflects light at said first wavelength and transmits light at said second wavelength.

10. The device according to claim 9, wherein the reflector is an interference reflector which is positioned closely adjacent to the re-emitting semiconductor construction; and
   wherein the device additionally comprises a TIR promoting layer immediately adjacent to the re-emitting semiconductor construction, the TIR promoting layer having a first index of refraction at said first wavelength and a second index of refraction at the second wavelength that is less than the first index of refraction.

11. The device according to claim 1, wherein the re-emitting semiconductor construction comprises a II-VI semiconductor.

12. The device according to claim 1, wherein the re-emitting semiconductor construction comprises a Cd(Mg)ZnSe alloy.

13. A device comprising:
   a) an LED capable of emitting light at a first wavelength;
   b) a re-emitting semiconductor construction capable of emitting light at a second wavelength in response to an absorption of light at the first wavelength which comprises at least one potential well not located within a pn junction; and an absorbing layer having a band gap energy less than or equal to an energy of a photon emitted by the LED and greater than a transition energy of the at least one potential well; and
   c) a reflector which transmits light at said first wavelength and reflects at least a portion of light at said second wavelength.

14. The device according to claim 13, wherein the absorbing layer is closely adjacent or immediately adjacent to at least one of said at least one potential well.

15. The device according to claim 13, wherein said at least one potential well includes a quantum well.

16. The device according to claim 13, wherein the reflector is positioned between the LED and the re-emitting semiconductor construction.

17. The device according to claim 13, wherein the reflector is a multilayer reflector.

18. The device according to claim 13, wherein the reflector is a non-planar flexible multilayer reflector.

19. A graphic display device comprising the device according to claim 13.

20. An illumination device comprising the device according to claim 13.

21. The device according to claim 13, wherein the re-emitting semiconductor construction comprises a Cd(Mg)ZnSe alloy.

22. A device comprising:
   a) a semiconductor unit comprising:
      i) a first potential well located within one of the at least one pn junctions which comprises a LED capable of emitting light at a first wavelength,
      ii) a second potential well not located within any of the at least one pn junctions which comprises a re-emitting semiconductor construction; and
      iii) an absorbing layer having a band gap energy less than or equal to an energy of a photon emitted by the LED and greater than a transition energy of the second potential well; and
   b) a reflector positioned to reflect light emitted from the LED onto the re-emitting semiconductor construction.

23. The device according to claim 22, wherein the absorbing layer is closely adjacent or immediately adjacent to said second potential well.

24. The device according to claim 22, wherein the second potential well includes a quantum well.

25. The device according to claim 22, wherein the re-emitting semiconductor construction is capable of emitting light at a second wavelength in response to an absorption of light at the first wavelength; and wherein the reflector reflects light at said first wavelength and transmits light at said second wavelength.

26. The device according to claim 25, wherein the reflector is an interference reflector which is positioned closely adjacent to the re-emitting semiconductor construction; and
wherein the device additionally comprises a TIR promoting layer immediately adjacent to the re-emitting semiconductor construction, the TIR promoting layer having a first index of refraction at said first wavelength and a second index of refraction at the second wavelength that is less than the first index of refraction.

27. The device according to claim 22, wherein the reflector is a multilayer reflector.

28. The device according to claim 22, wherein the reflector is a non-planar flexible multilayer reflector.

29. The device according to claim 22, wherein the reflector is a reflective polarizer layer.

30. A graphic display device comprising the device according to claim 22.

31. An illumination device comprising the device according to claim 22.

32. The device according to claim 22, wherein the re-emitting semiconductor construction comprises a Cd(Mg)ZnSe alloy.

* * * * *

UNITED STATES PATENT AND TRADEMARK OFFICE
CERTIFICATE OF CORRECTION

| | | |
|---|---|---|
| PATENT NO. | : 7,863,634 B2 | Page 1 of 1 |
| APPLICATION NO. | : 11/761148 | |
| DATED | : January 4, 2011 | |
| INVENTOR(S) | : Michael A. Haase | |

It is certified that error appears in the above-identified patent and that said Letters Patent is hereby corrected as shown below:

<u>Column 6,</u>
Line 4, Delete "Engineering Materials" and insert -- Engineering, Materials --, therefor.

<u>Column 20,</u>
Line 5, Delete "5 10." and insert -- 510. --, therefor.

Signed and Sealed this
Eighth Day of March, 2011

David J. Kappos
*Director of the United States Patent and Trademark Office*